United States Patent [19]
Arnett et al.

[11] 3,796,933
[45] Mar. 12, 1974

[54] SINGLE-PHASE CHARGE-COUPLED SEMICONDUCTOR DEVICE

[75] Inventors: Patrick C. Arnett, Jericho; Lawrence G. Heller, Essex Junction; Charles H. Stapper, Jr., Jericho, all of Vt.

[73] Assignee: International Business Machines Corporation, Armonk, N.Y.

[22] Filed: Nov. 10, 1971

[21] Appl. No.: 197,339

[52] U.S. Cl. ...... 317/235 R, 317/235 G, 317/235 B
[51] Int. Cl. ...... H01l 11/14
[58] Field of Search ...... 317/235 G, 235 B; 307/221 C

[56] References Cited

UNITED STATES PATENTS

| | | | |
|---|---|---|---|
| 3,651,349 | 3/1972 | Kahng et al. | 317/235 |
| 3,697,786 | 10/1972 | Smith | 317/235 |
| 3,449,645 | 6/1969 | Muller | 317/235 |
| 3,631,310 | 12/1971 | Das | 317/235 |
| 3,634,702 | 1/1972 | Drangeid | 317/235 |
| 3,676,715 | 7/1972 | Brojdo | 317/235 |

OTHER PUBLICATIONS

IBM Tech. Discl. Bul. "Unidirectional Charge Coupled Shift Register" by Anatha et al., Vol. 14, No. 4, 9/71, page 1234.

IBM Tech. Discl. Bul., "Ramp Potential MIS Device" by Heller et al., Vol. 19, No. 11, April, 1971, page 3559.

*Primary Examiner*—Jerry D. Craig
*Attorney, Agent, or Firm*—Francis J. Thornton

[57] ABSTRACT

A charge-coupled semiconductor device for transmitting information in the form of mobile charges through a depletion layer which comprises an electrode structure on the surface of a semiconductor body that has within it an elongated region containing an impurity gradient. When the body is biased to create a depletion under the region and packets of charges are introduced into the body near the region, the charges will under the influence of the field gradients in the depletion layer be caused to pass through the body, in a known period of time.

If due to space charge broadening the charge packets slowly spread out, they may be regrouped by applying a single clock pulse to the electrode structure, which will create sharply defined potential wells under the impurity gradient. The device is particularly useful as both a delay line and as a simple, fast, reliable, memory array.

9 Claims, 4 Drawing Figures

INVENTORS
PATRICK C. ARNETT
LAWRENCE G. HELLER
CHARLES H. STAPPER, JR.
BY Francis J. Thornton
ATTORNEY

SINGLE-PHASE CHARGE-COUPLED SEMICONDUCTOR DEVICE

RELATED APPLICATIONS

Application Ser. No. 95,225 filed on Dec. 4, 1970 by J. J. Chang and J. W. Sumilas and assigned to the same assignee as the present invention teaches that charge-coupled semiconductor devices can be operated with but two voltage phases, when the semiconductor device has an electrode array arranged on a contoured insulating layer on a surface of the body.

BACKGROUND OF THE INVENTION

Field of the Invention

This invention relates generally to monolithic integrated semiconductor structures including the fabrication thereof and more particularly to a monolithic device in which charges are created, maintained and transported within the semiconductor body without the necessity of P-N junctions in the body.

DESCRIPTION OF THE PRIOR ART

Recently there has been discussed in the literature semiconductor devices without fixed P-N junctions therein which utilize the property of the semiconductor material itself, together with appropriate electrodes on the surface of the device to transport charges through the body of the device.

Basically, these novel junctionless devices as described in the literature operate as follows:

The application of three out of phase voltages of the same intensity to a monolithic body of single type semiconductor material creates, within the body of the material, three different, well defined, depletion regions having three different field intensities therein corresponding to the three different applied voltages and when charges are introduced into such depletion regions, the charges are caused to be transported through the body in a controlled manner under the influence of the three created fields within the body. By appropriate manipulation of the three different imposed voltages, the charges can be recirculated, stored, or delayed in their movement through the body.

U.S. Pat. Nos. 3,374,406 and 3,374,407 teach various means of creating stepped and sloped inversion regions within FET type devices by creating stepped oxide ramps or alternating insulating layers of uniform thickness with different dielectric constants or by providing the channel of the FET with different conductivities in conjunction with the stepped oxide structure. In these patents such contoured inversion regions are used to control the flow of current between the source and drain of an FET device by controlling the pinch off levels of such devices. U.S. Pat. No. 3,430,112 teaches an insulated gate field effect transistor, having a surface channel area consisting of a plurality of areas having different surface resistivities extending across the body, can provide a remote cutoff characteristic for the device and thereby permit operation of the device as a vacuum triode analog.

SUMMARY OF THE INVENTION

The present invention is directed towards an improved charge-coupled semiconductor device.

It is an object of the invention to provide an improved semiconductor delay line.

It is another object of the invention to provide an improved semiconductor shift register array particularly suitable for use as a memory array.

It is a further object of the invention to provide a semiconductor charge-coupled device capable of being formed in a desirable size consistent with the state of the art integrated circuit techniques while occupying minimum area and consuming minimum power.

It is still another object of the invention to describe a process for producing such improved charge-coupled semiconductor devices that is simple, inexpensive and superior to any known process.

It is yet another object of the invention or provide an improved charge-coupled semiconductor device which uses a semiconductor body having a region therein which contains a greater concentration of impurity dopants therein than is contained in the body to create directionality of charge flow within the body.

The present invention is directed towards a charge-coupled semiconductor device which comprises a monolithic semiconductor body of a single semiconductor material having therein a region in which the concentration of impurity elements is graded in a uniform manner, so that charges may be caused to flow through the body in a controlled time.

The present invention also provides a single phase charge-coupled semiconductor device in which a region of different impurity concentration is disposed in a semiconductor body under an electrode array overlying an isolating layer on the surface of the body, such that when a depletion is created in the body and charges representing information are introduced thereto, a single time varying voltage applied to the electrode array creates in the depletion layer multiple potential wells beneath the electrode to maintain the information in its original form during its journey through the body.

This single phase operation, in particular, is accomplished by introducing into a selected region of the body a graded impurity concentration, of the same type of impurities originally contained in the body, and forming on the surface of the body an insulating layer over which there is deposited a multiple point conductive electrode array. Each point of the electrode of the array is arranged over the graded region so that charge packets previously injected in the body near the region and passing through the depletion layer under the region can be regrouped by the application of pulses to the electrode array even though they have begun spreading out due to space charge broadening.

These and other objects of the present invention will be more fully described in the following description of the preferred embodiments together with the accompanying drawings.

DESCRIPTION OF THE PREFERRED EMBODIMENTS

Figure 1:
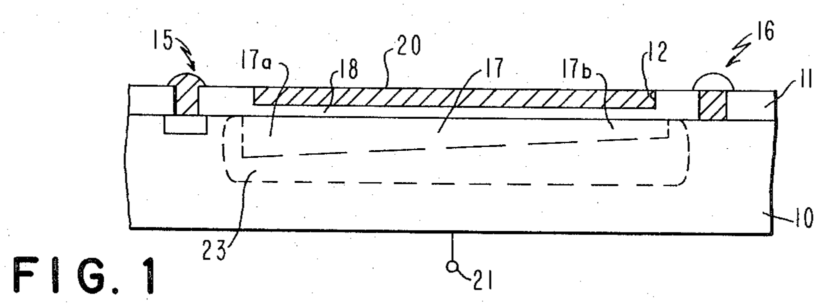
FIG. 1 illustrates a partial view of one embodiment of the present invention when used as a delay line.

Referring now to the drawings, two different embodiments of the present invention, a delay line and a shift register will be described in detail as to their construction and operation.

Illustrated in FIG. 1 is a monocrystalline body 10 of semiconductor material such as P-type silicon preferably having a dopant impurity concentration of approximately $4 \times 10^{14}$ impurity atoms per cubic centimeter and a resistivity of approximately 400 ohms - centimeter.

Although for the purpose of describing this invention, reference is made to P-type semiconductor material. It should be thoroughly understood that the opposite N-type conductivity material may also be utilized.

A layer 11 of any suitable insulating material such as silicon dioxide about 5000 angstroms thick is created on the surface of the body 10. Such a layer can be produced by any of the conventional oxidation processes; e.g., thermal oxidation, pyrolytic deposition or RF Sputtering.

Following the creation of layer 11 conventional masking and etching techniques are used to form in the layer 11 an opening 12.

Using the teachings of the aforementioned Application Ser. No. 95,225, a charge injector 15 is formed on the body 10 near one end of the opening 12 and a charge detector 16 is formed near the other end of opening 12.

A region 17 is now created within the body 10 beneath the opening 12. This region 17 is composed of the same conductivity type as the main portion of body 10. However, it is made to contain an impurity dopant concentration greatly different from that of body 10. Generally, region 17 is made with a graded concentration of impurity dopants therein and contains at one end 17*a*, a concentration of $10^{18}$ impurity dopants per cubic centimeter and at the opposite end 17*b*, a concentration of $10^{16}$ impurity dopants per cubic centimeter. Thus end 17*a* has a resistivity of 0.06 ohm-centimeter and end 17*b* has a resistivity of 1.5 ohm-centimeter. Intermediate the two ends, the impurity dopants will progress from one level to the other.

One method of producing the graded concentration region 17 in the semiconductor body 10 is by an ion implantation technique. Ion implantation equipment for modifying semiconductor bodies is now well known to the semiconductor art. Generally, such equipment comprises a source of ions mounted on an accelerator which accelerates the ions to a known potential. Once accelerated the ions, now in the form of a beam, pass through a deflection system which scans them across the surface of the semiconductor device into which they are to be implanted. Such ions bombarding the surface are stopped from penetrating into unwanted regions of the underlying semiconductor device by suitable masks over the surface of the body.

The depth of penetration of the ions into the sample body in the unmasked area is a function of; the energy of the impinging beam, the orientation of the underlying semiconductor body, thickness of any oxide layer on the surface of the body, and the ion concentration in the implanted region. The concentration of implanted ions in the sample is itself a function of the energy of the beams and the thickness of any surface layers as well as the length of time that a beam of a specified flux and energy continues to be directed against the semiconductor body being implanted. By controlling these variables, any desired gradient of ions may be implanted within any defined region. Since the ions penetrate straight into the material and do not generally move about in the body of the material after implantation, the implanted regions have relatively sharp boundaries and can be made to provide any desired concentration of implanted ions versus depth of implantation.

Generally, when the ions of only one energy are implanted in the body, the concentration of implanted ions versus the depth of implantation follows a normal gaussian distribution. However, by utilizing such variables, as crystal orientation, beam energy, flux and, etc., the obtained implantation can be deformed from the normal gaussian curve or distribution.

Thus the final concentration of impurity dopants implanted in the region 17 of the sample body 10 can readily be graded from a high concentration of approximately $10^{18}$ dopants per cubic centimeter at end 17*a* to a lower concentration of $10^{16}$ dopants per cubic centimeter at end 17*b*.

After formation of the region 17 with the desired concentration of impurity atoms, the semiconductor body 10 is removed from the ion implantation equipment and a new oxide layer 18 is grown over the surface of the body under the opening 12. Preferably this layer 18 is grown by using a conventional thermal oxide growth technique to a thickness of approximately 500 Angstroms. This thermal growth technique is preferred because the heating required for this process also causes annealing of the ion implanted region 17. This annealing causes the ions implanted in the region 17 to migrate from the interstitial positions in which they were implanted to substitutional positions so that they actively affect the resistivity of the region 17. Such annealing also eliminates any radiation damage that may have been created in the body by the implanation. Following the formation of oxide 18, a conductive electrode structure 20 is laid down over the surface of oxide 18 in opening 12. The electrode structure 20 is preferably of aluminum and has a thickness in excess of 2000 Angstroms. Subsequently, an electrical connection 21 is made to the main body 10.

The device of FIG. 1 is ideally suited for use as a semiconductor delay line. When so used, the electrode 20 is maintained at ground potential and the substrate of the main portion of body 10 is biased to a negative voltage, say about 10 volts, by the application of a voltage from a suitable source (not shown) to terminal 21. When the body 10 is so biased, a depletion layer 23 is formed in the body under region 17.

It is to be noted that the region 17 is shown as tapered with the end 17*a* containing the higher concentration of impurities. Because of this high concentration of impurities, end 17*a* penetrates deeper into the body than does the end 17*b* which contains a lesser concentration of impurities. However, this depletion layer 23 does not follow the contour of the region 17, instead as shown in this FIG. 1, it is substantially parallel with the surfaces of the body 10. This occurs because of the gradation of impurity concentration in region 17 which also causes the resistivity of the region to be graded. This change in resistivity causes a graded voltage drop in the body below the region 17. This field difference occurs because the voltage in the region of lower resistivity; e.g., 17*a* is lower than in the region of higher resistivity; thus, there appears in the body a lesser field under end 17*a*, than under end 17*b*.

Because the greatest potential difference from the bias of the body 10 within the depletion layer 23 occurs under the end 17*b*, which contains $10^{16}$ impurity dopants per cubic centimeter, electrons introduced into the body by proper biasing of the injector 15 will enter the depletion region under the nearer end 17*a* and travel under the influence of the fields existing in the depletion layer 23 to end 17*b*. The time that it takes for such electrons to pass down beneath the graded region 17, depends upon the length of region 17 and the intensity of the applied electric field. Table I below lists the delay time associated with different typical lengths of region 17 when region 17 is graded from $10^{16}$ to $10^{18}$ impurities per cubic centimeter.

| Delay | Length of Region 17 cm | microns | mils | Electric Field volts/cm |
|---|---|---|---|---|
| 100 nsec | $2.14\times10^{-3}$ | 21 | 0.86 | 56 |
| 1 μsec | $6.8\times10^{-3}$ | 60 | 2.7 | 17.5 |
| 10 μsec | $2.14\times10^{-2}$ | 210 | 8.6 | 5.6 |

Thus the device shown in FIG. 1 is well suited for uses as a delay line.

Figure 2:
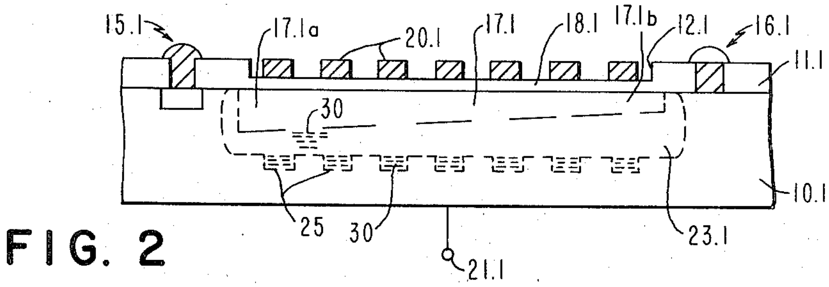
FIGS. 2 and 3 are idealized sections of a different embodiment of the present invention when used as a shift register and illustrate stages in the operation of the device.
Figure 3:
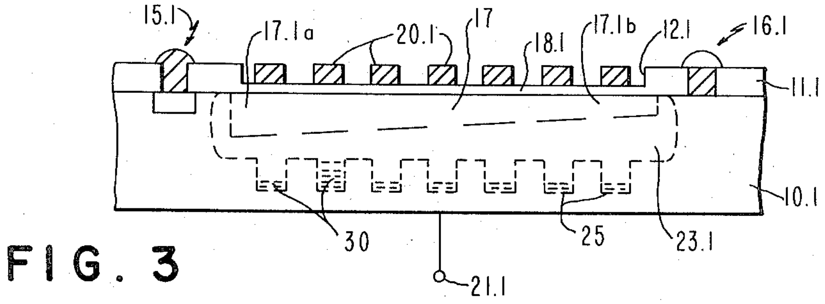
Figure 4:
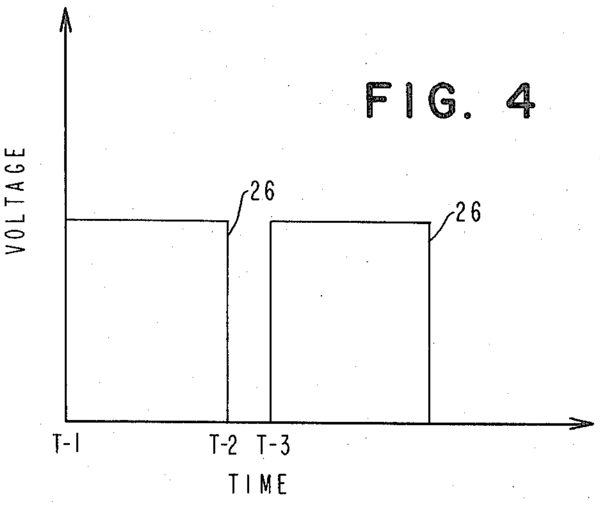
FIG. 4 illustrates the voltage pulse train applied to the electrodes of the array of FIGS. 2 and 3.

Turning now to FIGS. 2, 3 and 4, the operation of the device of the invention as a semiconductor shift register suitable for use in a memory array will be explained in detail.

FIGS. 2 and 3 show a semiconductor device substantially similar to the device of FIG. 1. Thus body 10.1 of these figures is composed of P-type silicon having an impurity level of about $4 \times 10^{14}$ impurity atoms per cubic centimeter with a resistivity of about 400 ohm-centimeters having on its upper surface an insulating layer 11.1; e.g., of silicon dioxide about 5000 Angstroms thick. This layer 11.1 is also treated using known techniques to create an opening 12.1 beneath which a region 17.1 of a resistivity different from that of the body 10.1 is created in the body 10.1 by the conventional ion beam implanation techniques as described in conjunction with FIG. 1. The region 17.1 of FIGS. 2 and 3 also has a graded concentration; that is, the end of 17.1*a* of region 17.1 is doped to a level of $10^{18}$ impurities per cubic centimeter, (a resistivity of 0.06 ohm-centimeter), while the opposite end 17.1*b* of the elongated region 17 is doped to the level of $10^{16}$ impurity per cubic centimeter (a resistivity of 1.5 ohm-centimeter) with the central portion of region 17.1 being graded between these concentrations. This device also has an injector 15.1 and a detector 16.1. Over the region 17.1, is a newly grown oxide layer 18.1 approximately 500 Angstroms in thickness.

In these figures, however, the single electrode 20 of FIG. 1 is replaced by a multiplicity of electrode strips 20.1 formed over the region 17.1. These electrode strips 20.1 are approximately 5000 Angstroms thick, about five microns wide and are separated from one another by a space of about three to five microns. These electrode strips 20.1 are all electrically interconnected one with the other. When a negative bias of about 10 volts is applied to the substrate 10.1 through electrical connection 21.1 from a suitable source, a depletion layer 23.1 is formed beneath the graded region 17.1, similar to that created under the region 17, shown in FIG. 1. However, in this instance, the electrode strips 20.1 being separated causes the depletion to assume a castellated form with a potential well or depression 25 occurring under each electrode strip 20.1. These wells 25 can be greatly expanded in depth, as shown in FIG. 3, by the application to the electrode strips 20.1, of the single clock pulse 26 shown in FIG. 4.

When the injector 15.1 is properly biased, minority charge carriers, in this example electrons, indicated by dashes 30, are introduced into the depletion layer 23.1 where they are caused by the electric fields in the depletion layer 23.1 to move from under the end 17.1*a* towards the end 17.1*b* where they can be detected by detector 16.1. Because the potential wells 25 exist below the bed of depletion layer 23.1, they will serve to trap a limited amount of initially introduced charge carriers. However, once the wells 25 shown in FIG. 2 become filled, they no longer have any influence on the device unless they are expanded as taught in conjunction with FIGS. 3 and 4. This filling of the potential wells 25 is accomplished by introducing a sufficient quantity of charges into the depletion layer 23.1 and allowing them to migrate across the depletion. Such charges migrating across the depletion region will fill the wells 25 at the bottom of the depletion underneath the electrodes and will remain there. Once the potential wells 25 have been filled, a packet of charges introduced into the depletion layer 23.1 near the end 17.1*a* of region 17.1 will, under the influence of the fields in the depletion layer 23.1, begin to migrate from under end 17.1*a* of region 17.1 towards the end 17.1*b* of region 17.1 without loss. However, due to space charge broadening, such packets of charges will begin to spread out and diffuse through the depletion layer 23.1, thus increasing the time needed to extract the information from the device and blurring the distinction between packets.

This invention will now solve this problem if, at time T–1 as shown in FIG. 4, when the charges begin to diffuse outward, a single-phase pulse positive voltage 26 of approximately 10 volts in magnitude is applied to the electrodes 20.1. This application of pulse 26 to electrodes 20.1 causes the potential wells 25 to deepen significantly. When so deepened, the migrating charges will be trapped in the next potential well 25 towards which they are traveling. This causes the charges to be collected therein. Thus the charge packet previously spread out by space charge broadening is once again regrouped.

At time T–2, the pulse 26 is returned to ground and the potential well 25 is returned to its normal state as shown in FIG. 2. The collected charges are now ejected from the reduced well again in packet form. Thus they return to their journey toward the end 17.1*b* of region 17.1 in the same form in which they began. At time T–3, the charges have once again diffused due to space charge broadening and once again the pulse 26 is applied to the electrode structure to deepen the wells 25 causing the charges to be again grouped. This recurring application of a pulse to the electrode 20.1 causes the timed deepening of the potential wells 25 and the grouping of charge packets. Thus the charges can be transmitted through the body in a known and controlled manner.

If such a packet of charges represents a binary "1" and the absence of such a packet of charges represents a binary "0",it is readily seen that such a device can be utilized as a shift register and if desired as a memory of the type as taught in Application Ser. No. 95,225.

Other embodiments can be readily advanced by those skilled in the art; for example, if desired by following the teachings of the aforementioned Patent Application Ser. No. 95,225, the concepts of the present invention can be utilized to direct packets of charges around corners and to opposite directions through a semiconductor device.

The present invention thus described has a number of unique advantages, especially when it is operated in the described shift register embodiment since it requires but a single clock pulse applied to it to permit the flow of information in bit form therethrough. Furthermore, this embodiment of the invention assures that the information received at its output will be identical to that received at its input. Moreover, the shift register of the present invention is considerably easier to fabricate that previously known charge-coupled shift registers since it uses but a single clock pulse and a uniform insulating layer over the graded region.

When fabricated as a delay line, the present invention also has the advantage of being easy to fabricate. Moreover, as noted in the specification, it can be made with a wide range of exact delay times.

While the invention has been particularly shown and described with reference to the preferred embodiments thereof, it will be understood by those skilled in the art that various changes in form and details of the apparatus and method may be made therein without departing from the spirit and scope of the invention and that the method is in no way restricted by the apparatus.

What is claimed is:

1. A charge-coupled semiconductor device for transmitting information in the form of minority charges which comprises, a semiconductor body having a major surface and containing therein a specified concentration of impurity dopants of a given conductivity type, injecting means coupled to said body for injecting minority charges in said body, output means coupled to said body for detecting minority charges in said body, a single region of the same conductivity type as said body located in said surface between said injecting means and said output means, said region being elongated in the direction between said injecting means and said output means and containing in the direction of said elongation a monotonically graded impurity concentration a single insulated electrode over said region, and means for impressing a given voltage on said electrode to create in said body beneath said region a directionality of flow of the injected minority charges.

2. The semiconductor device of claim 1 wherein said elongated region contains impurities ranging from $10^{18}$ impurities per cubic centimeter at one end thereof to $10^{16}$ impurities per cubic centimeter at the other end thereof.

3. A semiconductor device comprising, a semiconductor body, having a major surface and containing therein impurities of given conductivity type, injecting means for injecting charges coupled to the body, output means for detecting charges coupled to the body, a single region of the same conductivity type as said body located in said surface, said region being elongated along a direction of said major surface of the body between said injecting means and said output means and containing in the direction of elongation a monotonically varying impurity concentration gradient, an insulated electrode system over said region, said electrode system comprising a series of commonly connected spaced conductive points, means for impressing a given steady state voltage on said electrode system to create a graded depletion region in the body to transfer said injected charges through the body to the output means.

4. The device of claim 3 and further comprising means for impressing a single time varying voltage pulse to the electrode system for creating pulsed changes in said depletion region.

5. The device of claim 4 wherein said time varying voltage is an intermittent d.c. pulse.

6. The device of claim 5 wherein said semiconductor body is N-type, said steady state voltage is positive, and said d.c. pulse is negative.

7. The device of claim 5 wherein said d.c. pulse is positive, said steady state voltage is negative, and said semiconductor body is P-type.

8. A semiconductor device which utilizes the generation and mobility of charges in depletion regions created beneath the surface of a semiconductor body to transfer information as collected charges comprising, a semiconductor body having a major surface, injecting means for injecting charge coupled to said body, output means for detecting said charges coupled to said body, a region of the same conductivity type as said body located in said surface, between said injecting means and said output means, said region being elongated in the direction between said injecting means and said output means and having a monotonically varying impurity concentration gradient in said direction, a uniform insulating layer over the surface of said region, a multiplicity of electrodes disposed over said layer and over said region, means for biasing said injecting means to inject packets of minority charges representing bits of information into said body near said elongated region, means for applying a steady state voltage to said body and said electrodes to induce in said body, adjacent said elongated region, a depletion region having a field gradient therein, said gradient being in the direction of said elongated region to cause said injected packets of charges to flow through the depletion region, and means for impressing a series of voltage pulses on said electrodes to alternately extend and diminish in said depletion region a series of potential wells to cause said injected packets of charges flowing through said depletion region to substantially maintain their initial distribution in their passage through said depletion region.

9. A semiconductor device which utilizes the mobility of minority charges created in a semiconductor body to transmit information which comprises, a semiconductor body of a single type conductivity, injecting means for injecting charge coupled to said body, output means for detecting charge coupled to said body, an insulated electrode array deposited on a surface of the body with the electrodes of the array being electrically common, a region of the same conductivity type as said body in said surface between said injecting means and said output means and beneath said electrode array, said region being elongated in the direction between said injecting means and said output means, said elongated region being ion implanted and having a continuous unidirectional monotonically varying impurity concentration gradient of impurity dopants in said direction, means for applying a steady state voltage across the body, the elongated region, and the electrode array to create in the body a depletion region adjacent said elongated region, and means for applying a time varying electrical signal to the electrode array to create in said depletion region a multiplicity of potential wells.

* * * * *